United States Patent
Ilhan et al.

(10) Patent No.: US 9,356,767 B1
(45) Date of Patent: May 31, 2016

(54) HYBRID ANALOG/DIGITAL CLOCK RECOVERY SYSTEM

(71) Applicant: CADENCE DESIGN SYSTEMS, INC., San Jose, CA (US)

(72) Inventors: Ali Ulas Ilhan, Elkridge, MD (US); Eric Naviasky, Elkridge, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/827,875

(22) Filed: Aug. 17, 2015

(51) Int. Cl.
| | |
|---|---|
| *H04L 7/00* | (2006.01) |
| *H04L 7/04* | (2006.01) |
| *H03L 7/08* | (2006.01) |
| *H04B 3/462* | (2015.01) |

(52) U.S. Cl.
CPC ............ *H04L 7/0016* (2013.01); *H03L 7/0807* (2013.01); *H04B 3/462* (2013.01); *H04L 7/04* (2013.01)

(58) Field of Classification Search
CPC ........... H03L 7/06; H03L 7/08; H03L 7/0807; H03L 7/081; H03L 7/093; H03L 7/0994; H04B 3/462; H04L 7/0016; H04L 7/002; H04L 7/0025; H04L 7/033; H04L 7/0331
USPC ................. 375/326, 327, 371, 373, 375, 376; 327/146, 147, 151, 154–156, 160; 713/400, 502, 503
See application file for complete search history.

(56) References Cited

U.S. PATENT DOCUMENTS

| | | | | |
|---|---|---|---|---|
| 6,112,846 A | * | 9/2000 | Mukai | B62D 5/046 180/443 |
| 6,741,533 B1 | * | 5/2004 | Hiratsuka | G11B 7/0901 369/44.28 |
| 8,036,300 B2 | | 10/2011 | Evans et al. | |
| 8,710,929 B1 | | 4/2014 | Naviasky et al. | |
| 2010/0185304 A1 | * | 7/2010 | El-Rifai | G05B 11/42 700/45 |
| 2012/0033773 A1 | * | 2/2012 | Nedovic | H03L 7/0807 375/371 |
| 2013/0271186 A1 | * | 10/2013 | Hossain | H03L 7/235 327/107 |
| 2014/0043177 A1 | * | 2/2014 | Pagnanelli | H03M 3/30 341/143 |
| 2014/0253004 A1 | * | 9/2014 | Gebregergis | H02P 21/06 318/400.21 |
| 2015/0030106 A1 | * | 1/2015 | Hashida | H04L 27/22 375/329 |

* cited by examiner

*Primary Examiner* — Young T Tse
(74) *Attorney, Agent, or Firm* — Rosenberg, Klein & Lee

(57) ABSTRACT

In a clock recovery system, a phase detector detects a phase error in an incoming data signal, which it outputs as a differential pair of voltage signals representing positive and negative errors, respectively. A proportional filter generates a proportional offset from the phase error, also as a differential pair of voltage signals. An integral filter generates an integral offset from the proportional offset, using positive and negative voltage controlled oscillators to generate oscillating integral offset signals, and an accumulator to increment or decrement a digital counter for each cycle of the integral offset signals. A first, fractional phase interpolator operating over a ninety-degree range adjusts the phase of an initial clock signal to generate an intermediate clock signal, according to the proportional offset. A second phase interpolator adjusts the phase of the intermediate clock signal to generate an adjusted clock signal, according to the integral offset.

18 Claims, 8 Drawing Sheets

HYBRID ANALOG/DIGITAL CLOCK RECOVERY SYSTEM

BACKGROUND OF THE INVENTION

The subject system and method are generally directed to digital communications clock recovery. In particular, although not exclusively, a hybrid clock recovery system of analog and digital components adjusts the timing of a digital communications clock based on a phase error detected in an incoming signal.

When a data signal is sent from one device to another, it is important for the receiving device to have a clock signal properly synchronized with the data signal, so the boundary between each unit of data (e.g. a bit or a byte) in the data signal can be properly determined and the value of the unit thereby determined. If the receiving device clock signal is not synchronized with the data signal, the data signal value might be misread, as the receiving device is unsure when one unit of data is complete and the next has begun. At present speeds of data transmission, on the order of gigahertz, this clock signal must be accordingly precise, both generally and in the ability of the receiving device to synchronize it with the data signal.

The source device of a data signal may be plesiochronous with the receiving device, meaning that their clocks do not have exactly the same frequency and will slowly drift out of alignment. A data signal may also have "jitter" due to adjusting conditions, such as atmospheric or electromagnetic interference, "crosstalk," or simple changes in distance between devices. Both these factors make synchronization an ongoing process.

The synchronizing process is generally handled by a circuit which delays either the data signal or the receiving device clock signal such that the "edges" of the two signals are re-aligned. To put it another way, the circuit determines a "phase" or "offset" of the data signal in comparison to the clock signal and applies the offset to the clock signal (or, in some systems, the timing of the data signal) to re-align the two.

However, present digital components have practical limits to the rate at which they can generate and apply the offset, particularly in response to the unpredictable effects of jitter. At the same time, analog components have their own limits. A more effective design, therefore, is desirable.

SUMMARY OF THE INVENTION

It is an object of the disclosed systems and methods to perform a clock recovery process at a speed allowing for higher data transmission speeds and jitter bandwidth than in the prior art.

It is another object of the disclosed systems and methods to divide the operations of a clock recovery system between analog and digital components according to which can complete said operations faster and more efficiently.

While not limited thereto, a disclosed embodiment is directed to a clock recovery system including a phase detector, proportional and integral filters, and first and second phase interpolators. The phase detector receives an incoming data signal and detects a phase error in the data signal. The proportional filter receives the phase error from the phase detector and generates a proportional offset from the phase error. The integral filter receives the proportional offset from the proportional filter and generates an integral offset. The first phase interpolator receives the proportional offset from the proportional filter, receives an initial clock signal, and generates an intermediate clock signal adjusted in phase from the initial clock signal by the proportional offset. The second phase interpolator receives the integral offset from the integral filter, receives the intermediate clock signal from the first phase interpolator, and generates an adjusted clock signal adjusted in phase from the intermediate clock signal by the integral offset.

While not limited thereto, another disclosed embodiment is directed to a clock recovery system including a phase detector, a proportional filter, positive and negative voltage controlled oscillators, an accumulator, and first and second phase interpolators. The phase detector receives an incoming data signal, detects a phase error in the data signal, and outputs the phase error as a differential pair of voltage signals, the differential pair including a positive error signal active when the phase error is positive and a negative error signal active when the phase error is negative. The proportional filter receives the phase error from the phase detector and generates a proportional offset from the phase error as a differential pair of voltage signals, the differential pair including a positive proportional offset signal active when the proportional offset is positive and a negative proportional offset signal active when the proportional offset is negative. The positive voltage controlled oscillator receives the positive proportional offset signal and generates a positive integral offset signal in the form of an oscillating signal. The negative voltage controlled oscillator receives the negative proportional offset signal and generates a negative integral offset signal in the form of an oscillating signal. The accumulator receives the positive and negative integral offset signals, increments a present count value for each cycle of the positive integral offset signal, decrements the present count value for each cycle of the negative integral offset signal, and generates an integral offset based on the present count value. The first phase interpolator receives the proportional offset from the proportional filter, receives an initial clock signal, and generates an intermediate clock signal adjusted in phase from the initial clock signal by the proportional offset. The second phase interpolator receives the integral offset from the integral filter, receives the intermediate clock signal from the first phase interpolator, and generates an adjusted clock signal adjusted in phase from the intermediate clock signal by the integral offset.

In certain embodiments of the disclosed system, the accumulator may reset the present count value to a minimum count value upon incrementing from a maximum count value, and reset the present count value to the maximum count value upon decrementing from the minimum count value. The accumulator may include a digital counter which stores the present count value.

While not limited thereto, another disclosed embodiment is directed to a method of synchronizing a clock signal to a data signal. The method includes detecting a phase error between the clock signal and the data signal, transmitting the phase error in analog form to an analog proportional filter, generating a proportional offset from the phase error, using the analog proportional filter, the analog proportional filter restraining the proportional offset to within a range of less than three-hundred-and-sixty degrees, transmitting the proportional offset in analog form to an analog first phase interpolator, adjusting an initial clock signal by the proportional offset to generate an intermediate clock signal, transmitting the proportional offset to an integral filter, generating an integral offset from the proportional offset, using the integral filter, transmitting the integral offset to a second phase interpolator, and adjusting the intermediate clock signal by the integral offset to generate an adjusted clock signal. The phase error and proportional offset may each be transmitted as a differential pair of voltage signals. The integral offset may be generated by generating a positive integral offset signal from a positive differential signal of the proportional offset, using an incrementing voltage controlled oscillator, generating a negative integral offset signal from a negative differential signal of the proportional offset, using a decrementing voltage controlled oscillator, incrementing a present count value in an integral accumulator for each cycle of the positive integral offset signal, decrementing the present count value in the integral accumulator for each cycle of the negative integral offset signal, and outputting the present count value as the integral offset.

Additional aspects, details, and advantages of the disclosed system will be set forth, in part, in the description and figures which follow.

DETAILED DESCRIPTION OF THE PREFERRED EMBODIMENTS

Figure 1:
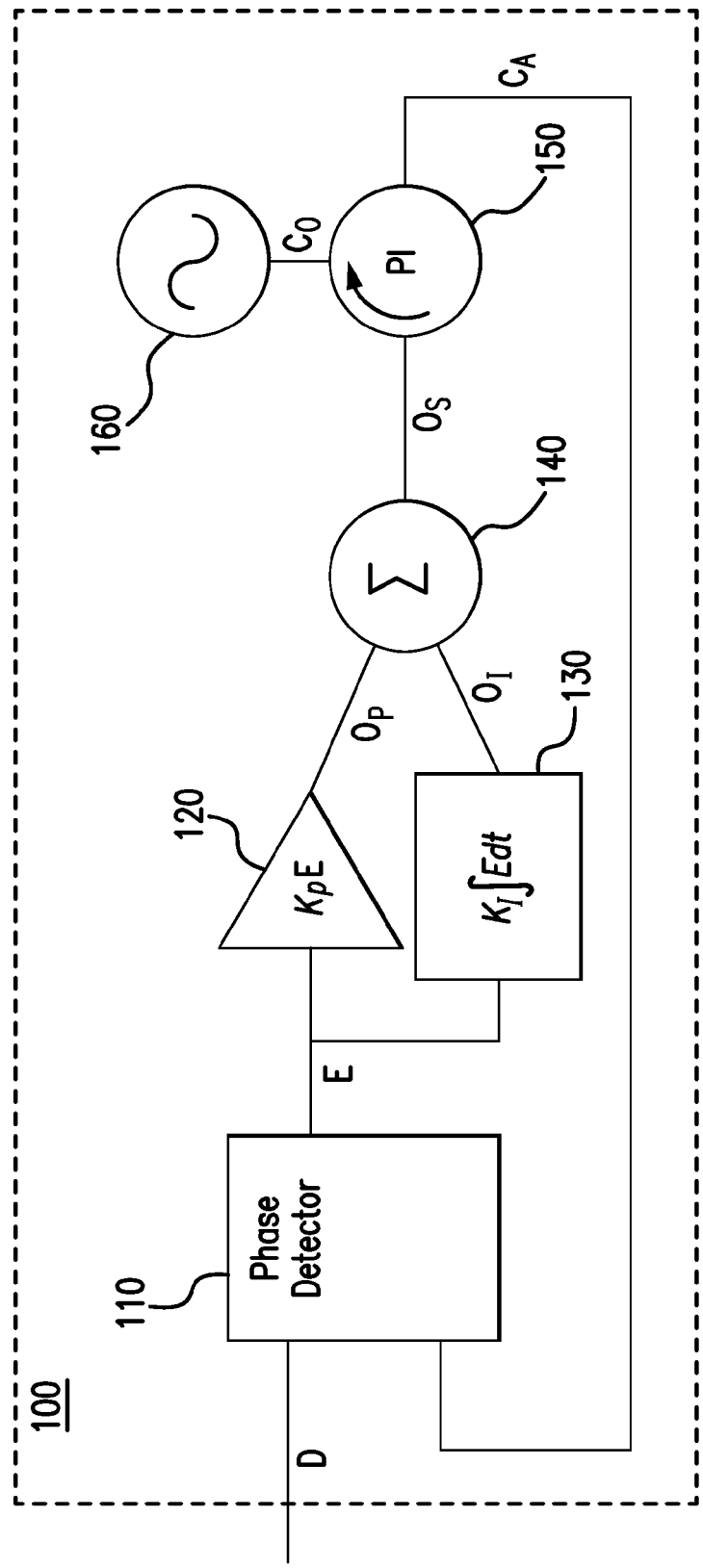
FIG. 1 is a block diagram depicting a first embodiment of a clock recovery system.

Reference will now be made in detail to exemplary embodiments, which are illustrated in the accompanying drawings, wherein like reference numerals refer to the like elements throughout. The embodiments are described below in order to explain the disclosed system and method by referring to the figures.

A data transmission (or data signal, the terms being used interchangeably herein) generally involves the use of a periodic cycle, where each unit of data, such as a bit, lasts for one cycle. For instance, in a simple example, a data transmission might have a 1 kilohertz frequency, meaning each cycle is one millisecond; therefore, each bit is transmitted for a single millisecond and then the next bit begins. Modern transmission speeds are much faster, on the order of gigahertz.

To read a data transmission accurately, a receiving device must generally know both the frequency and phase of the data transmission cycle. With this information, a clock or clock signal of the receiving device may be synchronized with the data transmission, and the boundary between each bit may be determined so that each bit may be read correctly. The phase must generally be determined at the time the data transmission is received, as it will vary depending on variables such as the distance the data transmission has traveled and the possibility of interference or interruption, whether at the source or in transit. These variables can change over time, altering the phase in either direction in the form of "jitter." Furthermore, when a source and destination of a signal are not based on a single clock, such as when both are within a single device, the clocks of the source and destination can be expected to be plesiochronous. That is, even when operating at supposedly identical frequencies, a slight difference between clocks will result in one being slightly faster than the other, and therefore the data signal will slowly but steadily drift out of alignment with the clock of the receiving device, effectively altering the phase in this manner as well. Therefore, regular re-determination of the phase is generally necessary to account for both jitter and drift.

The difference in phase between the cycle of the receiving device clock signal and that of the received data transmission is sometimes called the phase error, and the adjustment of the phase of the clock signal by means of an applied offset to match the phase of the data transmission is sometimes known as a clock recovery.

For convenience, this description will assume throughout that the receiving device clock signal is adjusted to match the phase of the received data transmission. However, it is noted that these principles may be applied, with minor alteration within the understanding of those skilled in the art, to adjust the phase of the received data transmission instead.

One general mechanism of error correction which may be applied to clock recovery is the proportional-integral controller. In such a controller, a proportional term and an integral term are respectively generated by a proportional filter and an integral filter, the proportional term representing the present error and the integral term representing accumulated past error that has not yet otherwise been adjusted for; the terms are then summed to determine the total error (in this case, a total phase offset) to be corrected. Many such controllers are known in the art.

A variation of the proportional-integral controller is the proportional-integral-derivative (PID) controller, which also predicts future error through a derivative term. Although the description to follow will assume a proportional-integral controller, those of skill in the art will be able to adapt the disclosures herein to a PID controller.

Herein, embodiments of a clock recovery system using variants on a proportional-integral controller, adapting a clock signal to synchronize with an incoming data signal, will be described.

According to the embodiment depicted in FIG. 1, a clock recovery system 100 may be a component of a larger receiving device (not depicted). The clock recovery system 100 comprises a phase detector 110 receives an incoming data signal D, in most cases from a transmitting device. The phase detector 110 detects a phase error E in the data signal D, using any number of methods known in the art, although one possible configuration will be later described in reference to FIG. 6B.

The phase detector 110 provides the phase error E to both a proportional filter 120, which generates a proportional offset $O_P$, and an integral filter 130, which generates an integral offset $O_I$. In some embodiments, $O_P$ is may be the result of multiplying the phase error E by a proportional constant $K_P$; that is, $O_P = K_P * E$. In some embodiments, $O_I$ may be the result of an integration of the phase error E over time, multiplied by an integral constant $K_I$; that is, $O_I = K_I * \int E \, dt$. $K_P$ and $K_I$ may be, or may represent, path gains of the respective paths through the filters. Generally, the proportional offset $O_P$ reflects the jitter, while the integral offset $O_I$ reflects the plesiochronous drift.

An adder 140 receives the proportional offset $O_P$ and integral offset $O_I$ from their respective filters 120 and 130, and adds the two offsets to generate a summed offset $O_S$. The summed offset $O_S$ is then provided to a phase interpolator 150. The phase interpolator 150 also receives an initial clock signal $C_0$, from a full rate clock 160 or similar. The phase interpolator 150 then applies the summed offset $O_S$ to $C_0$, in most embodiments by adding $O_S$ to the phase of $C_0$, to generate an adjusted clock signal $C_A$.

The phase interpolator 150 may now provide the adjusted clock signal $C_A$ to other components of the receiving device (not depicted), which may read the contents of the incoming data signal D in accordance with $C_A$.

The incoming data signal D may be expected to alter its timing due to the jitter based on changes in relative position between the transmitting and receiving devices, or interference from the environment or crosstalk. Additionally, the frequency of the full rate clock 160 may not match the frequency of the incoming data signal D precisely due to their plesiochronous nature, resulting in a steady creation of additional phase error through drift. Therefore, once the adjusted clock signal $C_A$ is generated, in at least some embodiments the phase interpolator 150 may also provide it back to the phase detector 110, creating a feedback loop where further clock signal adjustments in accordance with further changes to the incoming data signal D, or to continually adapt to a shorter or longer frequency of the incoming data signal D, may be managed. That is, in further cycles of the feedback loop of the system, the phase detector 110 uses the adjusted clock signal $C_A$ for comparison in determining whether the incoming data signal D still contains a phase error E, and how much.

It will be recognized that, on the first cycle of the system, $C_A$ will not yet have been adjusted, and will therefore be equivalent to $C_0$. Therefore, on said first cycle, the phase detector 110 will have a clock signal equivalent to $C_0$ available for comparison to the incoming data signal D.

Figure 2A:
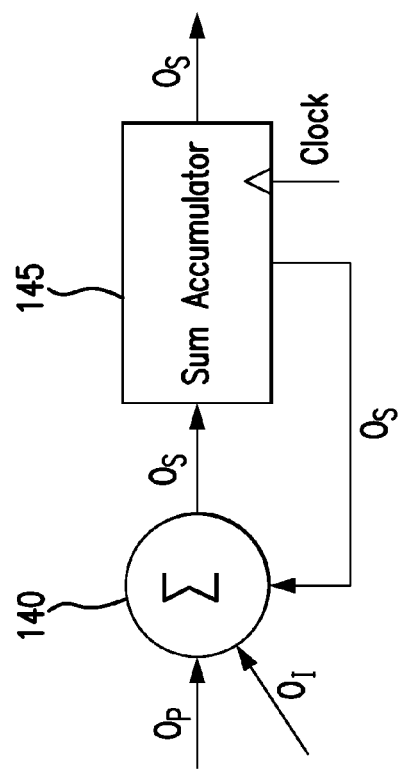
FIG. 2A is a block diagram depicting an embodiment of an adder and sum accumulator portion of a clock recovery system.
Figure 2B:
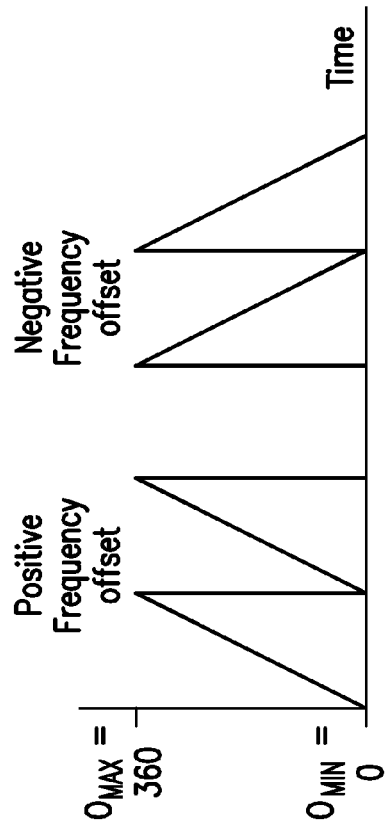
FIG. 2B is a graph depicting effects of the embodiment of FIG. 2A on the value of a summed offset.

A phase interpolator 150 can only adjust the phase over a range of 360 degrees, and therefore $O_S$ requires the application of a modulo operation in advance of the phase adjustment. In one embodiment, a portion of which is depicted in FIG. 2A, this modulo operation is accomplished by including a sum accumulator 145 following the adder 140, the sum accumulator 145 having maximum and minimum values $O_{MAX}$ and $O_{MIN}$, respectively. When the adder 140 provides a summed offset $O_S$ larger than $O_{MAX}$, the sum accumulator 145 "rolls over" to $O_{MIN}$ and begins incrementing again, producing the value $(O_S \text{ MOD } O_{MAX}) + O_{MIN}$. Similarly, when the adder 140 provides a summed offset Os smaller than $O_{MIN}$, the sum accumulator 145 "rolls under" to $O_{MAX}$ and begins decrementing again. An example of the output of the sum accumulator 145 as first an increasing $O_S$ and then a decreasing $O_S$ is provided over time, in an embodiment where $O_{MAX}=360$ degrees and $O_{MIN}=0$ degrees, is shown in the graph depicted in FIG. 2B. It will be recognized that the resulting output of a sum accumulator 145 in such an embodiment produces the desired modulo operation.

It is noted that the sum accumulator 145 may allow negative values, or the equivalent thereof. In such an embodiment, $O_{MAX}$ may equal, for instance, 180 degrees and $O_{MIN}$ may equal −180 degrees. The configuration of the phase interpolator may be adapted to account for this range.

The "roll-over" and "roll-under" operations desired in the sum accumulator 145 are most easily accomplished by a digital counter, which naturally performs such operations when the counter is asked to increment while at a maximum value, or asked to decrement while at a minimum value. In analog, this is a more complicated problem, and existing solutions are comparably inefficient.

However, digital solutions also have certain disadvantages when compared to an analog phase interpolator. First, digital components have a limited resolution, as they must have all available values defined in advance by means of bit assignment; in contrast, analog components have effectively infinite resolution. Second, digital components have considerably greater latency than analog, which is especially problematic when responding to the random and rapid changes seen in jitter, and therefore places a limitation on the bandwidth of the jitter that the system can track.

Figure 3C:
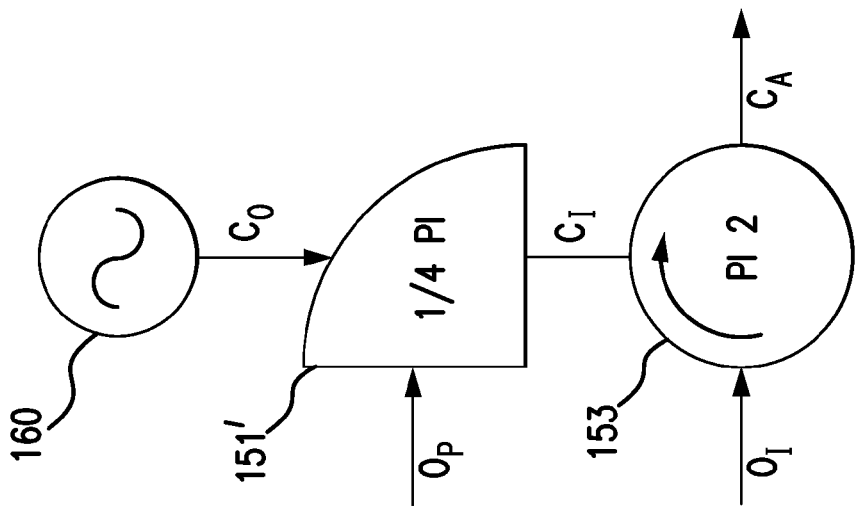
FIG. 3C is a block diagram depicting yet another embodiment of a phase interpolator portion of a clock recovery system, using two phase interpolators, one of which is a fractional phase interpolator.
Figure 3B:
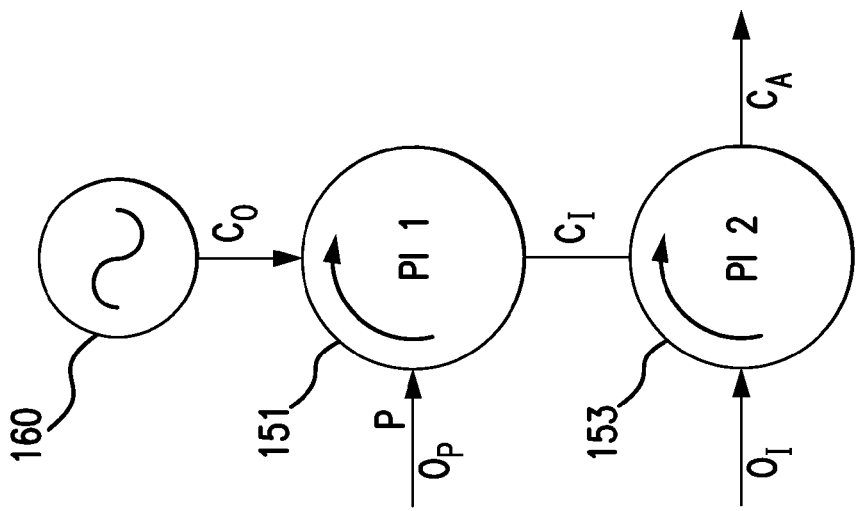
FIG. 3B is a block diagram depicting another embodiment of a phase interpolator portion of a clock recovery system, using two phase interpolators.
Figure 3A:
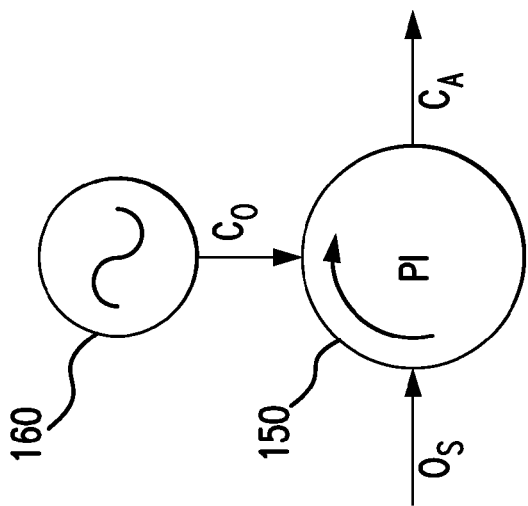
FIG. 3A is a block diagram depicting an embodiment of a phase interpolator portion of a clock recovery system, using a single phase interpolator.

FIG. 3A re-depicts a portion of the embodiment of FIG. 1, namely the phase interpolator 150 and full-rate clock 160. Again, the summed offset $O_S$—which, depending on the embodiment, may have been adjusted by a sum accumulator 145 such as seen in FIG. 2A—is provided to the phase interpolator 150. The phase interpolator 150 applies the summed offset $O_S$ to the initial clock signal $C_0$, provided by the full rate clock 160, and outputs a resulting adjusted clock signal $C_A$.

FIG. 3B depicts another embodiment of this portion of the clock recovery system 100, in an embodiment where the offsets $O_P$ and $O_I$ are not summed together in advance of the clock signal adjustment. As depicted in FIG. 3B, first and second phase interpolators 151 and 153 replace the single phase interpolator 150 of FIG. 3A. The first phase interpolator 151 receives the proportional offset $O_P$ from the proportional filter 120, applies it to the initial clock signal $C_0$ provided by the full rate clock 160, and outputs a resulting intermediate clock signal $C_I$. The second phase interpolator 153 receives the integral offset $O_I$ from the proportional filter 120, and also receives the intermediate clock signal $C_I$ from the first phase interpolator 151; it then applies $O_I$ to $C_I$ and outputs the adjusted clock signal $C_A$.

Because the proportional offset $O_P$, by itself, represents only the jitter, and the jitter has a predictable maximum and minimum value, an appropriate selection of the value of $K_P$ will guarantee that $O_P$ falls within a given range no larger than a 360 degree range. The modulo operations are therefore unnecessary for the proportional offset $O_P$, if not the integral offset $O_I$. As a result, the proportional filter 120 and the first phase interpolator 151, and the transmittal of the proportional offset $O_P$ therebetween, may operate in analog, without the need for a sum accumulator 145 or similar in the proportional branch of the clock recovery system 100. For instance, the proportional offset $O_P$ may be transmitted as an analog voltage signal. Additionally, the first phase interpolator 151 may be of an analog design, such as that described in U.S. Pat. No. 8,710,929, which has been incorporated by reference.

As another example, in the depicted embodiment of FIG. 3C, the range of possible values of the proportional offset $O_P$ is limited to a 90 degree range (e.g. 0 to 90 degrees, or −45 to 45 degrees), again due to an appropriate selection of the value of $K_P$. $O_P$ is then received by a fractional phase interpolator 151' which has been configured with the assumption that the range will be so limited. The fractional phase interpolator 151' otherwise operates in the same manner as the first phase interpolator 151 does in FIG. 3B, and the other depicted components also operate in the same manner.

By further narrowing the range of $O_P$, the precision of the fractional phase interpolator 151' may be correspondingly improved, allowing the same phase interpolator design to express a smaller offset over the same operation. That is to say, the fractional phase interpolator 151' depicted in FIG. 3C has four times the precision of the first phase interpolator 151 depicted in FIG. 3B. Because, in this embodiment, the fractional phase interpolator 151' considers ¼ the range of a standard phase interpolator, it may also be termed a ¼ phase interpolator; however, similar embodiments may operate on other scales, and those of skill in the art will be able to apply the same principles to a fractional phase interpolator having any range less than 360 degrees.

Figure 4:
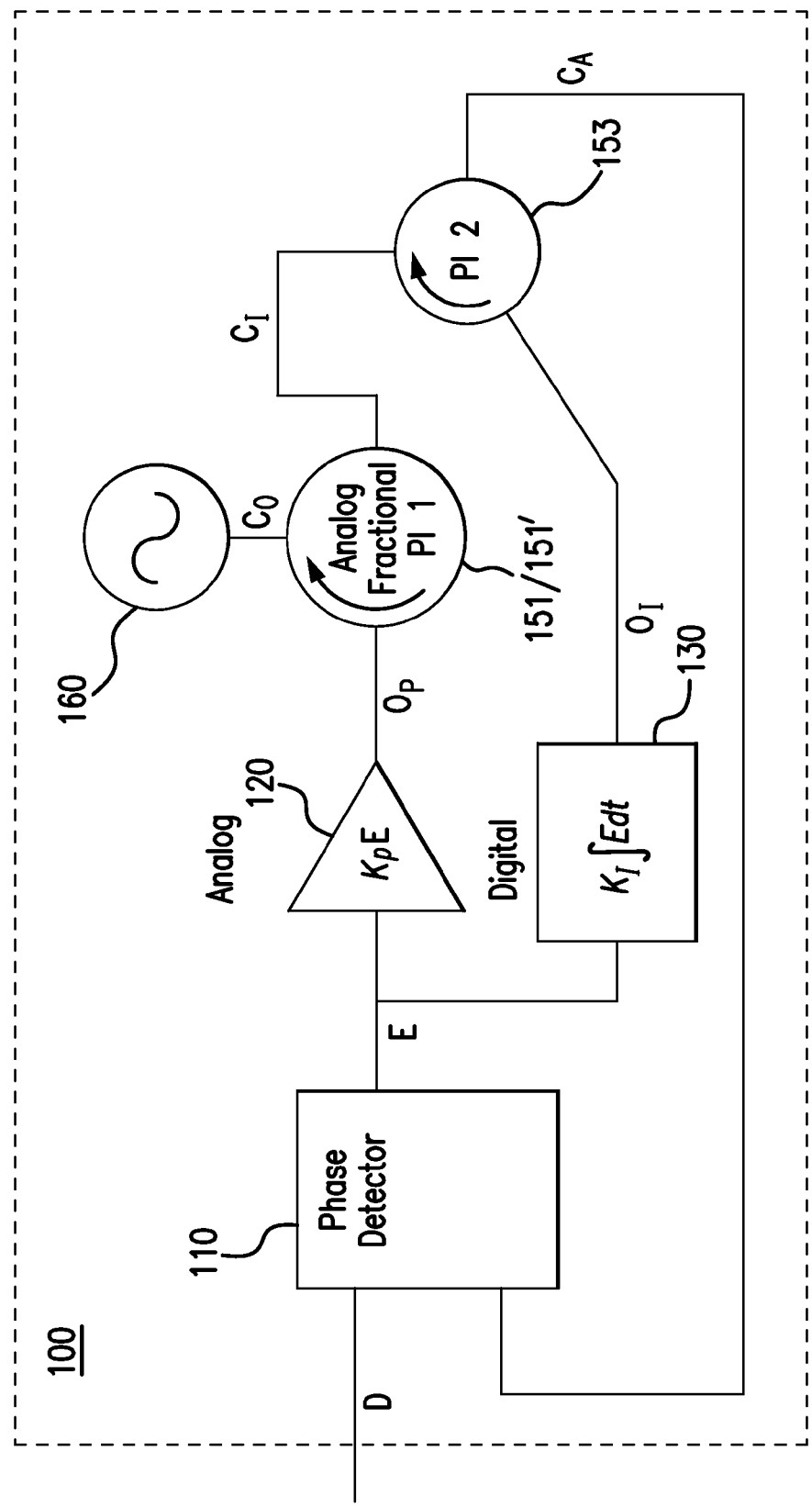
FIG. 4 is a block diagram depicting a second embodiment of a clock recovery system.

The principles depicted in FIGS. 3B and 3C may be applied to the clock recovery system 100 depicted in FIG. 1, in accordance with the embodiment depicted in FIG. 4. As in FIG. 1, the phase detector 110 receives the incoming data signal D and detects the phase error E. The phase detector 110 then provides E to both the proportional filter 120 and the integral filter 130, which generate the proportional offset $O_P$ and integral offset $O_I$, respectively. However, no adder 140 is present to generate the summed offset $O_S$. Instead, the proportional filter 120 provides the proportional offset $O_P$ to the first phase interpolator 151 (or the fractional phase interpolator 151'), and the integral filter 130 provides the integral offset $O_I$ to the second phase interpolator 153. As noted previously, this arrangement allows both the proportional filter 120 and the first/fractional phase interpolator 151/151' to operate in analog, although the integral filter 130 and second phase interpolator 153 remain digital as depicted.

The two phase interpolators collectively generate the intermediate and adjusted clock signals $C_I$ and $C_A$, as described for FIGS. 3B and 3C, and the second phase interpolator 153 then outputs the adjusted clock signal $C_A$, which it may provide back to the phase detector 110, and also to other components of the receiving device (not depicted).

Figure 5:
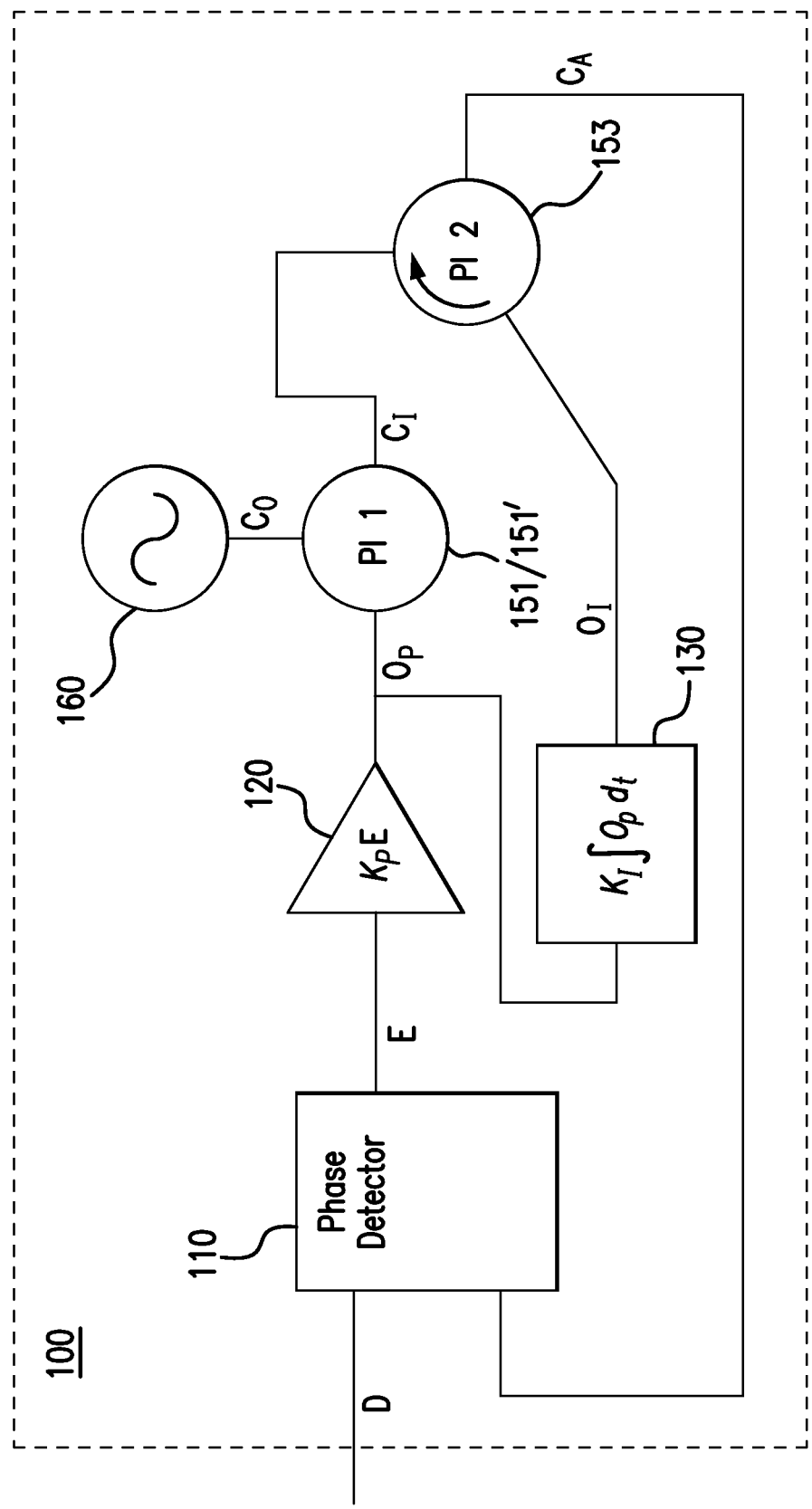
FIG. 5 is a block diagram depicting a third embodiment of a clock recovery system.

Another embodiment of the clock recovery system 100 is depicted in FIG. 5. As in FIG. 4, the phase detector 110 receives the incoming data signal D and detects the phase error E. However, the phase detector 110 provides the phase error E only to the proportional filter 120, which generates the proportional offset $O_P$ as before and provides it to the first/fractional phase interpolator 151/151'.

The proportional filter 120 also provides the proportional offset $O_P$ to the integral filter 130 which, when generating the integral offset $O_I$, uses $O_P$ where the previous described embodiments would use the phase error E. For instance, in some embodiments, $O_I = K_I * \int O_P \, dt$. This arrangement allows $O_I$ to account for the proportional offsets, and not merely the phase error E.

The generation of the integral offset $O_I$ may also account for some or all of the operations of the proportional filter 120, applying an inverse operation such as $1/K_P$ to remove any undesired scaling of $O_P$ resulting from the proportional filter 120.

The integral filter 130 provides the integral offset $O_I$ to the second phase interpolator 153. The two phase interpolators collectively generate the intermediate and adjusted clock signals $C_I$ and $C_A$, as previously described for FIGS. 3B, 3C, and 4, and the second phase interpolator 153 then outputs the adjusted clock signal $C_A$, which it may provide back to the phase detector 110 and also other components of the receiving device (not depicted).

Figure 6A:
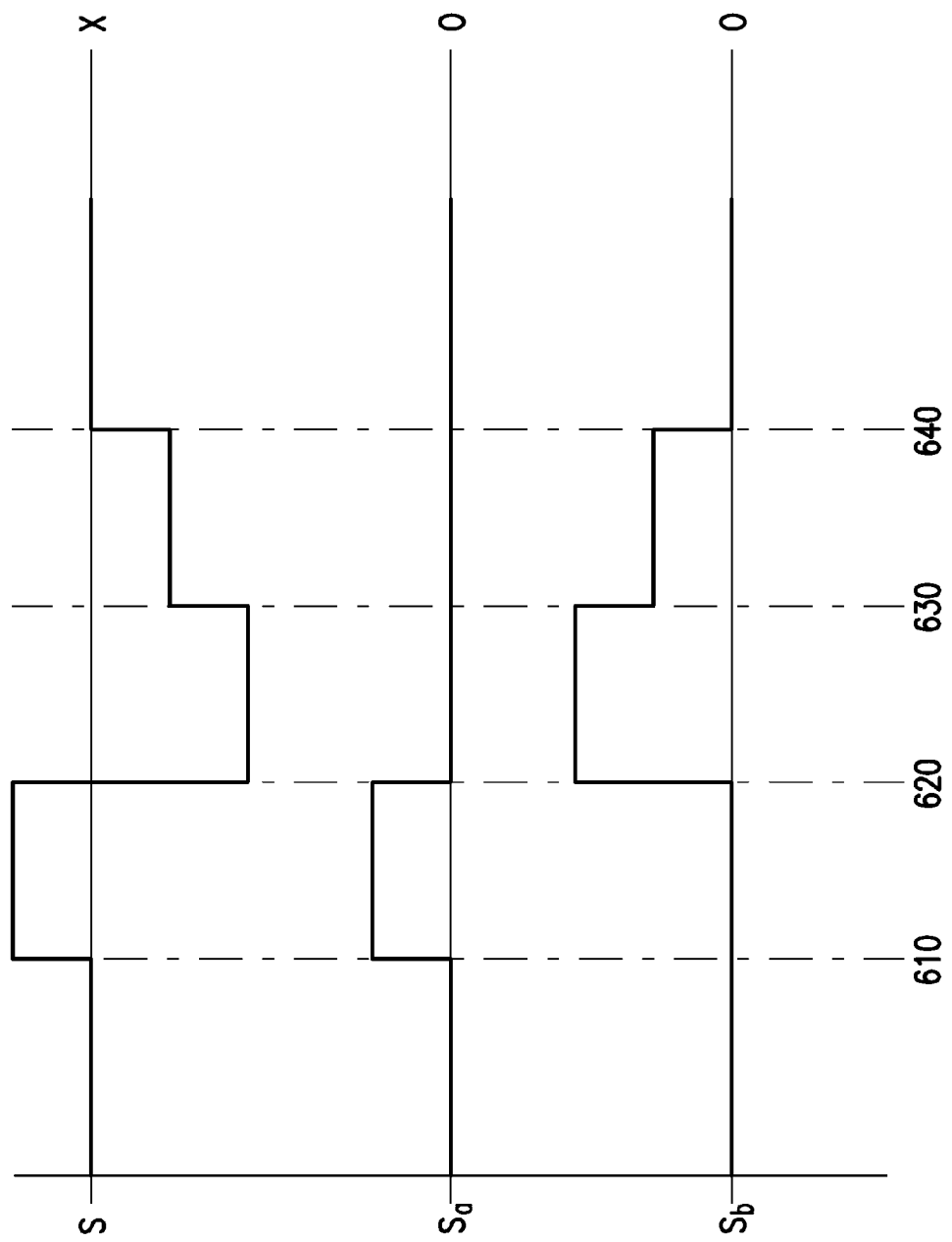
FIG. 6A is a graph depicting the interrelation of an original signal and a differential pair of signals.

A differential pair of signals may divide an analog signal, such as a voltage signal, into "high" and "low" values based on a reference value. Differential signals and their generation are known in the art, but the basic principles thereof are presented in a simplified form in FIG. 6A, which depicts an original signal S, a "high" differential signal $S_a$ derived therefrom, and a "low" differential signal $S_b$ derived therefrom. In FIG. 6A, S has a defined reference value X. Until a first time 610, the value of S is X, and $S_a$ and $S_b$ are at 0. At 610, the value of S rises to 1 above X. The value of $S_a$ becomes 1, while $S_b$ remains 0 because S is presently not below X. At a second time 620, the value of S changes to 2 below X. Because S is now not above X, the value of $S_a$ changes to 0, while the value of $S_b$ changes to 2 to reflect the "low" value of S. At a third time 630, the value of S changes to 1 below X; the value of $S_b$ likewise changes to 1, while the value of $S_a$ remains 0. At a fourth time 640, the value of S returns to X, and both $S_a$ and $S_b$ return to a value of 0.

In an undepicted second example, reference value X may be the present value of another signal, and therefore itself changing. In such an example, $S_a$ would have a non-zero value when the signal S presently has a greater value than the signal X, and $S_b$ would have a non-zero value when the signal X presently has a greater value than the signal S.

Figure 6B:
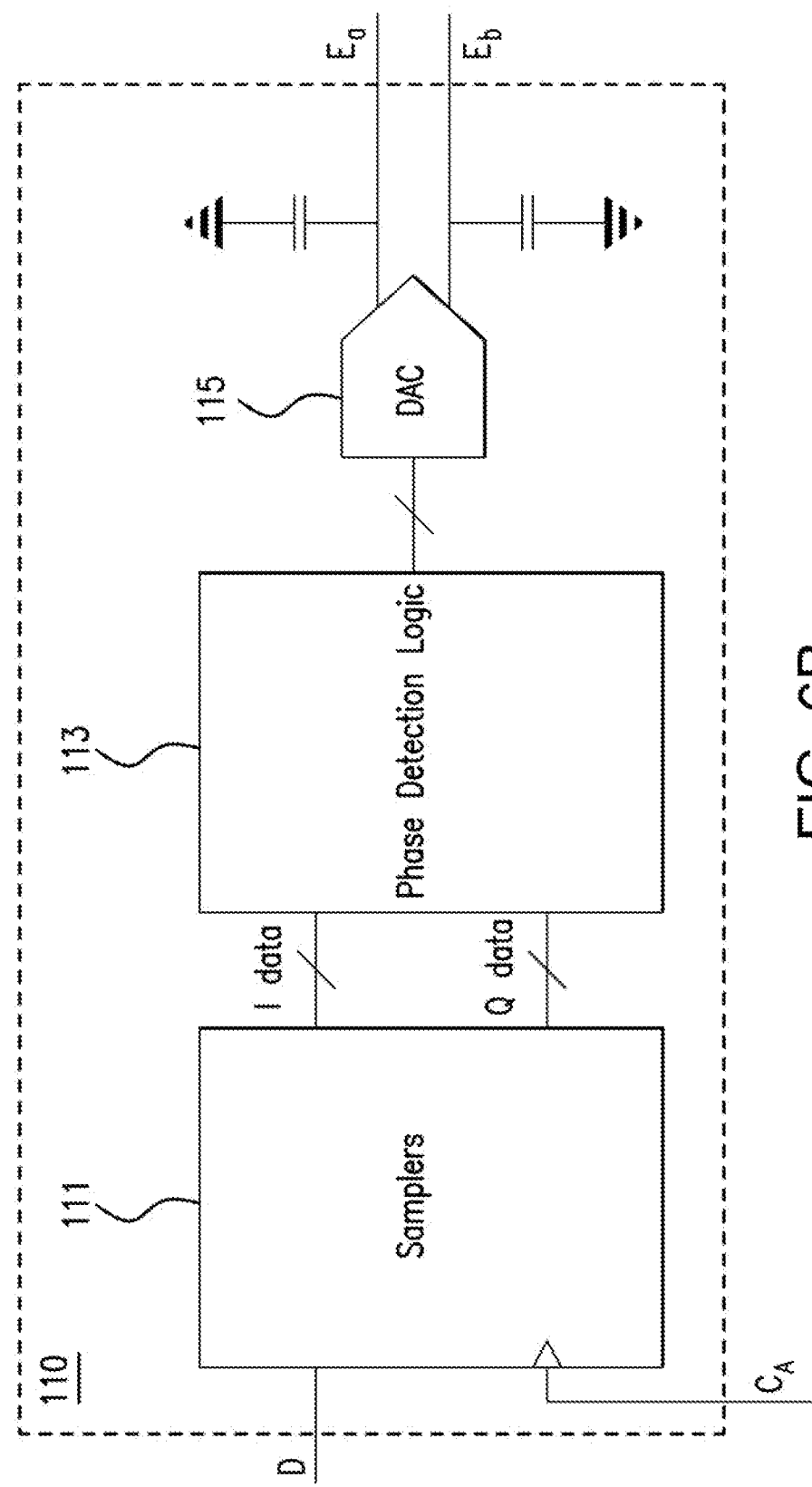
FIG. 6B is a block diagram depicting an embodiment of a phase detector portion of a clock recovery system.
Figure 6C:
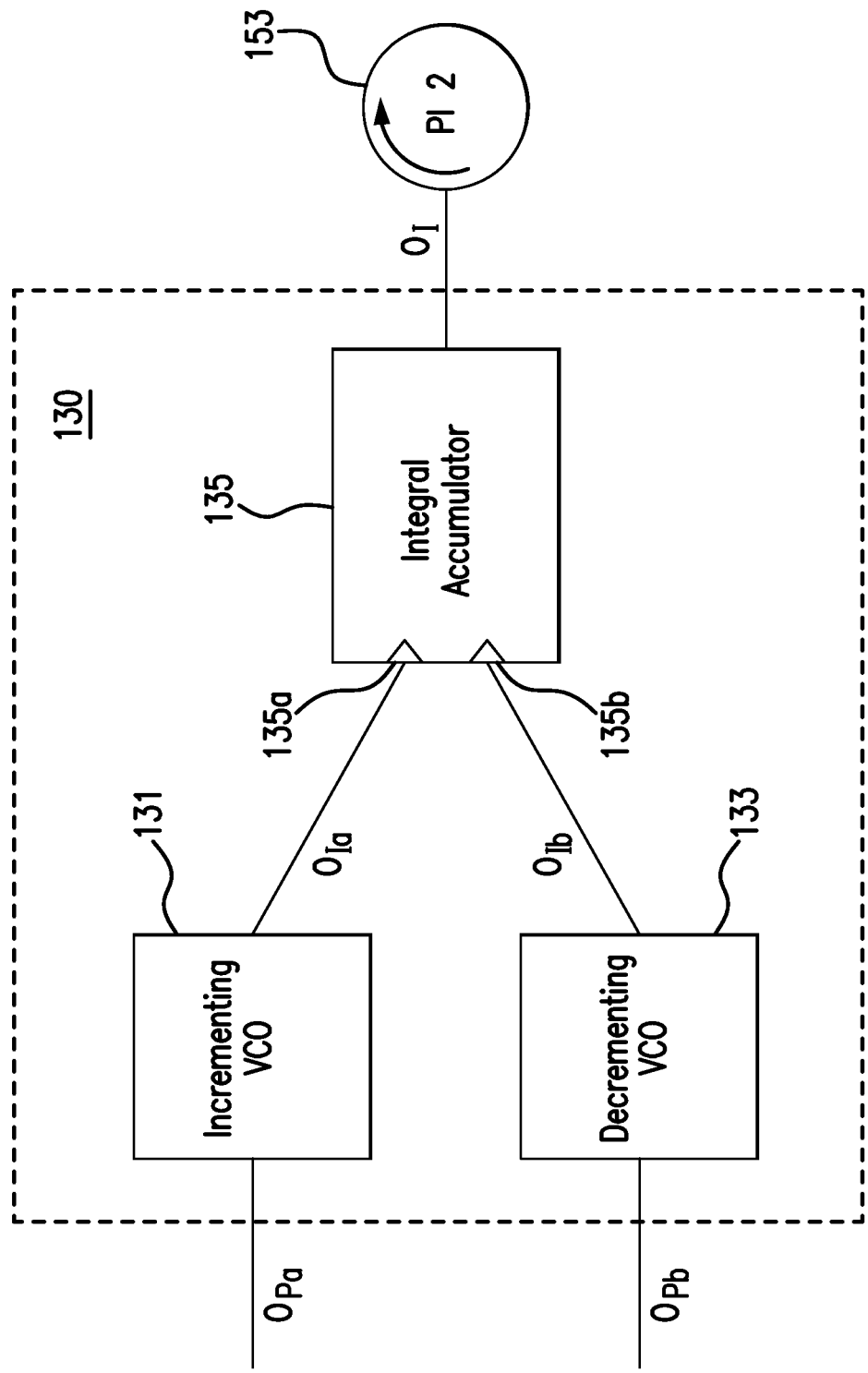
FIG. 6C is a block diagram depicting an embodiment of an integral filter portion of a clock recovery system.

FIGS. 6B and 6C depict portions of variants of the embodiments of FIGS. 4 and 5, wherein the clock recovery system 100 may make use of a differential pair of signals. In these embodiments, the phase detector 110 generates a differential pair of signals $E_a$ and $E_b$, expressing the phase error E through $E_a$ if the incoming data signal D is offset in advance of a present clock signal (i.e. a "positive" error), and through $E_b$ if the incoming data signal D is offset behind the present clock signal (i.e. a "negative" error). The distinction between "in advance of" and "behind" is somewhat arbitrary as the error is relative to a cyclical period, and although hereinafter it will be assumed that the phase detector 110 divides the two evenly at 180 degrees both before and after, embodiments can be imagined where the distinction is set at a different point, such as 90 degrees before and 270 degrees after. $E_a$ and $E_b$ may be termed positive and negative phase error signals, respectively.

In the embodiment depicted in FIG. 6B, the phase detector 110 includes samplers 111, phase detection logic 113, and a digital-to-analog converter 115.

The samplers 111 sample the value of the incoming data signal D in reference to the clock signal $C_A$. (It is noted that, on the first cycle of the overall system, $C_A$ will be unadjusted and equivalent to $C_0$.) Operating on the assumption that $C_A$ is accurate, the samplers 111 sample the value of D at the assumed middle of each data bit, which is transmitted on the I data bus, and again at the assumed edge of each data bit, which is transmitted on the Q data bus.

The samples in both buses are received by the phase detection logic 113, which watches for the value of I to change, indicating a transition in the data signal D (i.e. the value of D changed from 1 to 0 or vice versa). When a transition is detected, the value of I before and after the transition is then compared to the value of Q in between; if Q matches the value of I before the transition, the sampling of Q, and therefore the phase of $C_A$ in comparison to the phase of D, are "early", and if Q matches the value of I after the transition, Q and therefore $C_A$ are "late."

The phase detection logic 113 may consider several samples of Q in comparison to I to confirm whether $C_A$ is early or late. The result may then be outputted as a "vote" boolean value, simply representing whether there were more "early" samples of Q than "late" samples. The result may alternatively be outputted as a "score" representing how many more early samples than late samples were detected (e.g. if there were two more "early" samples than "late," the output would be +2, and if there were three more "late" samples than "early," the output would be −3); this configuration is often preferable as a more precise adjustment may be averaged over time. It is noted that the assignment of "early" as the "positive" or "true" output is somewhat arbitrary, and a reverse assignment may be similarly configured.

The samplers 111 and the phase detection logic 113 may be digital. The output of the phase detection logic 113 may therefore be received by the digital-to-analog converter 115, or DAC, which converts the output to analog for the benefit of later components. The DAC 115 may also divide the output into differential signals, namely the positive phase error $E_a$ and the negative phase error $E_b$, $E_a$ reflecting when the output is an "early" output and $E_b$ reflecting when the output is a "late" output. $E_a$ and $E_b$ may take the form of voltage signals, which are transmitted through paired conductors. Capacitors may be included on each conductor to average the voltage over a period of time.

It is noted that a DAC may also be employed in embodiments where only a single phase error E is outputted by the phase detector 110, and indeed at any location in any embodiment of the system where an analog signal is needed but a digital signal is provided. Likewise, an analog-to-digital converter, or ADC, may be employed in the inverse cases.

It is also noted that other embodiments of the phase detector 110 can be imagined by those of skill in the art which will produce positive and negative phase error values $E_a$ and $E_b$ in the form of analog signals, and which may substitute for the embodiment depicted in FIG. 6B without otherwise altering the clock recovery system 100.

In embodiments where the phase error is transmitted as a differential pair $E_a$ and $E_b$, $O_P$ is likewise transmitted as a differential pair $O_{Pa}$ and $O_{Pb}$ (not depicted), the first signal active when the offset is positive (or greater than a reference value) and the second when the offset is negative (or less than a reference value). That is to say, a signal through $O_{Pa}$ signifies that the phase of the intermediate clock signal $C_I$ should increase, and a signal through $O_{Pb}$ signifies that the phase of $C_I$ should decrease. $O_{Pa}$ and $O_{Pb}$ may be termed positive and negative proportional offset signals, respectively. As with $E_a$ and $E_b$, $O_{Pa}$ and $O_{Pb}$ may be analog voltage signals transmitted through paired conductors. In these embodiments, the proportional filter 120, and the first/fractional phase interpolator 151/151', may be any number of analog filters and phase interpolators known in the art capable of processing an analog differential pair input.

In these embodiments, the integral filter 130 includes a pair of voltage controlled oscillators, or VCOs, as depicted in FIG. 6C. Specifically, an incrementing (or positive) VCO 131 receives $O_{Pa}$ and a decrementing (or negative) VCO 133 receives $O_{Pb}$, which may together form a differential pair of voltage signals. The two VCOs generate $O_{Ia}$ and $O_{Ib}$ respectively, which in this embodiment each take the form of oscillating signals, wherein a higher voltage of $O_{Pa}$ produces a higher frequency of $O_{Ia}$, and a higher voltage of $O_{Pb}$ produces a higher frequency of $O_{Ib}$. $O_{Ia}$ and $O_{Ib}$ may be termed positive and negative integral offset signals, respectively.

It is noted that, when the embodiment of the integral filter 130 depicted in FIG. 6C is combined with the system embodiment depicted in FIG. 4, instead of that of FIG. 5, the incrementing VCO 131 and the decrementing VCO 133 receive $E_a$ and $E_b$, respectively, instead of $O_{Pa}$ and $O_{Pb}$.

$O_{Ia}$ and $O_{Ib}$ are then both provided to an integral accumulator 135 through separate ports 135a and 135b, respectively. The integral accumulator 135 is configured to increment a present counter value with each cycle of the $O_{Ia}$ signal received at 135a, and to decrement the present counter value with each cycle of the $O_{Ib}$ signal received at 135b. Thus, the higher the frequency of $O_{Ia}$, the more rapidly the integral accumulator 135 will increment, and likewise, the higher the frequency of $O_{Ib}$, the more rapidly the integral accumulator 135 will decrement. If $O_{Ia}$ and $O_{Ib}$ have equal frequency—that is, if $O_{Pa}$ and $O_{Pb}$ (or $E_a$ and $E_b$) have equal voltage—the integral accumulator 135 will maintain its present value.

In this arrangement, the two VCOs 131 and 133 provide the integral portion of the desired function for the integral filter 130.

The integral accumulator 135 then provides the present counter value as a single integral offset signal $O_I$ to the second phase interpolator 153.

Like the sum accumulator 145 of FIG. 2A, the integral accumulator 135 may have maximum and minimum values, such as $O_{MAX}=360$ degrees and $O_{MIN}=0$ degrees, or $O_{MAX}=180$ degrees and $O_{MIN}=-180$ degrees, and have the "roll-over" and "roll-under" operations thereof. Also like the sum accumulator 145, this may be easily implemented by means of a digital counter.

It is noted that, in this arrangement, the integral filter 130 also serves as an analog-to-digital converter. Because the integral offset $O_I$ reflects the plesiochronous drift, which is generally steady, the second phase interpolator 153 does not have as great a need for low latency as the first phase interpolator 151, and may therefore be a digital phase interpolator. The integral accumulator 135 may in turn provide the modulo operation necessary for a non-fractional phase interpolator.

With the inclusion of the elements depicted in FIG. 6C and, optionally, FIG. 6B into the clock recovery system 100 depicted in FIG. 5, most components of clock recovery system 100 operate in analog, and various disadvantages of digitally conducting certain proportional, integral, and phase interpolator operations may be avoided. At the same time, the integral accumulator 135, and more specifically the counter, is digital, and may cleanly manage the roll-over and roll-under operations in a more efficient manner than an analog accumulator.

The descriptions above are intended to illustrate possible implementations of the disclosed system and method, and are not restrictive. While this disclosure has been made in connection with specific forms and embodiments thereof, it will be appreciated that various modifications other than those discussed above may be resorted to without departing from the spirit or scope of the disclosed system. Such variations, modifications, and alternatives will become apparent to the skilled artisan upon a review of the disclosure. For example, functionally equivalent elements may be substituted for those specifically shown and described, and certain features may be used independently of other features, and all or some of the above embodiments may be selectively combined with each other, and in certain cases, particular locations of elements or order of operations may be reversed or interposed, all without departing from the spirit or scope of the disclosed system as defined in the appended claims. The scope should therefore be determined with reference to the description above and the appended claims, along with their full range of equivalents.

What is claimed is:

1. A clock recovery system comprising:
   a phase detector receiving an incoming data signal and an adjusted clock signal, the phase detector detecting a phase error in the data signal;
   a proportional filter receiving the phase error from the phase detector and generating a proportional offset from the phase error, the proportional filter being an analog filter;
   an integral filter receiving the proportional offset from the proportional filter and generating an integral offset;
   a first phase interpolator receiving the proportional offset from the proportional filter, receiving an initial clock signal, and generating an intermediate clock signal adjusted in phase from the initial clock signal by the proportional offset, the first phase interpolator being an analog phase interpolator; and a second phase interpolator receiving the integral offset from the integral filter, receiving the intermediate clock signal from the first phase interpolator, and generating the adjusted clock signal adjusted in phase from the intermediate clock signal by the integral offset.

2. The clock recovery system of claim 1, wherein the first phase interpolator is a fractional phase interpolator which adjusts the initial clock signal over a range of less than three-hundred-and-sixty degrees.

3. The clock recovery system of claim 1, wherein the first phase interpolator is a one-quarter phase interpolator which adjusts the initial clock signal over a range of ninety degrees.

4. The clock recovery system of claim 1, wherein the phase detector outputs the phase error as a differential pair of voltage signals, the differential pair including a positive error signal active when the phase error is positive and a negative error signal active when the phase error is negative.

5. The clock recovery system of claim 4, wherein the proportional filter generates the proportional offset as a differential pair of voltage signals, the differential pair including a positive proportional offset signal active when the proportional offset is positive and a negative proportional offset signal active when the proportional offset is negative.

6. The clock recovery system of claim 5, wherein the integral filter includes:

an incrementing voltage controlled oscillator receiving the positive proportional offset signal and generating a positive integral offset signal in the form of an oscillating signal, a decrementing voltage controlled oscillator receiving the negative proportional offset signal and generating a negative integral offset signal in the form of an oscillating signal, and an integral accumulator receiving the positive and negative integral offset signals, incrementing a present count value for each cycle of the positive integral offset signal, decrementing the present count value for each cycle of the negative integral offset signal, and generating the integral offset based on the present count value, wherein the integral accumulator resets the present count value to a minimum count value upon incrementing from a maximum count value, and resets the present count value to the maximum count value upon decrementing from the minimum count value.

7. The clock recovery system of claim 6, wherein the integral accumulator includes a digital counter which stores the present count value.

8. The clock recovery system of claim 6, wherein the maximum count value is three-hundred-and-sixty and the minimum count value is zero.

9. A clock recovery system comprising:

a phase detector receiving an incoming data signal and an adjusted clock signal, detecting a phase error in the data signal, and outputting the phase error as a differential pair of voltage signals, the differential pair including a positive error signal active when the phase error is positive and a negative error signal active when the phase error is negative;

a proportional filter receiving the phase error from the phase detector and generating a proportional offset from the phase error as a differential pair of voltage signals, the differential pair including a positive proportional offset signal active when the proportional offset is positive and a negative proportional offset signal active when the proportional offset is negative;

a positive voltage controlled oscillator receiving the positive proportional offset signal and generating a positive integral offset signal in the form of an oscillating signal;

a negative voltage controlled oscillator receiving the negative proportional offset signal and generating a negative integral offset signal in the form of an oscillating signal;

an accumulator receiving the positive and negative integral offset signals, incrementing a present count value for each cycle of the positive integral offset signal, decrementing the present count value for each cycle of the negative integral offset signal, and generating an integral offset based on the present count value;

a first phase interpolator receiving the proportional offset from the proportional filter, receiving an initial clock signal, and generating an intermediate clock signal adjusted in phase from the initial clock signal by the proportional offset; and a second phase interpolator receiving the integral offset from the accumulator, receiving the intermediate clock signal from the first phase interpolator, and generating the adjusted clock signal adjusted in phase from the intermediate clock signal by the integral offset.

10. The clock recovery system of claim 9, wherein the accumulator resets the present count value to a minimum count value upon incrementing from a maximum count value, and resets the present count value to the maximum count value upon decrementing from the minimum count value.

11. The clock recovery system of claim 10, wherein the maximum count value is three-hundred-and-sixty and the minimum count value is zero.

12. The clock recovery system of claim 9, wherein the accumulator includes a digital counter which stores the present count value.

13. The clock recovery system of claim 9, wherein the first phase interpolator is a fractional phase interpolator which adjusts the initial clock signal over a range of less than three-hundred-and-sixty degrees.

14. The clock recovery system of claim 9, wherein the first phase interpolator is a one-quarter phase interpolator which adjusts the initial clock signal over a range of ninety degrees.

15. A method of synchronizing a clock signal to a data signal, the method comprising:

detecting a phase error between the clock signal and the data signal;

transmitting the phase error in analog form to an analog proportional filter;

generating a proportional offset from the phase error, using the analog proportional filter, the analog proportional filter restraining the proportional offset to within a range of less than three-hundred-and-sixty degrees;

transmitting the proportional offset in analog form to an analog first phase interpolator;

adjusting an initial clock signal by the proportional offset to generate an intermediate clock signal;

transmitting the proportional offset to an integral filter;

generating an integral offset from the proportional offset, using the integral filter;

transmitting the integral offset to a second phase interpolator; and adjusting the intermediate clock signal by the integral offset to generate an adjusted clock signal as the clock signal.

16. The method of claim 15, wherein the phase error is transmitted as a differential pair of voltage signals.

17. The method of claim 15, wherein the proportional offset is transmitted as a differential pair of voltage signals.

18. The method of claim 17, wherein the integral offset is generated by:
- generating a positive integral offset signal from a positive differential signal of the proportional offset, using an incrementing voltage controlled oscillator;
- generating a negative integral offset signal from a negative differential signal of the proportional offset, using a decrementing voltage controlled oscillator;
- incrementing a present count value in an integral accumulator for each cycle of the positive integral offset signal;
- decrementing the present count value in the integral accumulator for each cycle of the negative integral offset signal; and
- outputting the present count value as the integral offset.

* * * * *